United States Patent
Alie et al.

(10) Patent No.: US 8,309,389 B1
(45) Date of Patent: Nov. 13, 2012

(54) PHOTOVOLTAIC SEMICONDUCTOR DEVICES AND ASSOCIATED METHODS

(75) Inventors: Susan Alie, Stoneham, MA (US); Stephen D. Saylor, South Hamilton, MA (US); Christopher J. Vineis, Watertown, MA (US)

(73) Assignee: SiOnyx, Inc., Beverly, MA (US)

( * ) Notice: Subject to any disclaimer, the term of this patent is extended or adjusted under 35 U.S.C. 154(b) by 20 days.

(21) Appl. No.: 12/879,950

(22) Filed: Sep. 10, 2010

Related U.S. Application Data

(60) Provisional application No. 61/241,283, filed on Sep. 10, 2009.

(51) Int. Cl.
H01L 21/00 (2006.01)

(52) U.S. Cl. .......................... 438/71; 438/57

(58) Field of Classification Search ............. 438/57, 438/69–72
See application file for complete search history.

(56) References Cited

U.S. PATENT DOCUMENTS

| | | | |
|---|---|---|---|
| 3,487,223 A | 12/1969 | St. John | |
| 4,277,793 A | 7/1981 | Webb | |
| 4,419,533 A | 12/1983 | Czubatyj et al. | |
| 4,663,188 A | 5/1987 | Kane | |
| 5,381,431 A * | 1/1995 | Zayhowski | 372/25 |
| 6,194,722 B1 | 2/2001 | Fiorini et al. | |
| 6,372,611 B1 | 4/2002 | Horikawa | |
| 6,429,037 B1 * | 8/2002 | Wenham et al. | 438/57 |
| 7,057,256 B2 | 6/2006 | Carey, III et al. | |
| 7,354,792 B2 | 4/2008 | Carey, III et al. | |
| 7,390,689 B2 | 6/2008 | Mazur et al. | |
| 7,442,629 B2 | 10/2008 | Mazur et al. | |
| 7,456,452 B2 | 11/2008 | Wells et al. | |
| 7,504,702 B2 | 3/2009 | Mazur et al. | |
| 7,511,750 B2 | 3/2009 | Murakami | |
| 7,781,856 B2 | 8/2010 | Mazur et al. | |
| 7,816,220 B2 | 10/2010 | Mazur et al. | |
| 7,884,439 B2 | 2/2011 | Mazur et al. | |
| 7,884,446 B2 | 2/2011 | Mazur et al. | |
| 2008/0258604 A1 | 10/2008 | Mazur et al. | |
| 2009/0160983 A1 | 6/2009 | Lenchenkov | |
| 2009/0194671 A1 | 8/2009 | Nozaki et al. | |
| 2009/0200586 A1 | 8/2009 | Mao et al. | |
| 2010/0143744 A1 | 6/2010 | Gupta et al. | |
| 2010/0219506 A1 | 9/2010 | Gupta et al. | |

FOREIGN PATENT DOCUMENTS

| | | |
|---|---|---|
| JP | 63116421 | 5/1988 |
| JP | 2152226 | 6/1990 |
| JP | 9298308 | 11/1997 |
| WO | WO2009/100023 | 8/2009 |

OTHER PUBLICATIONS

Tull; Femtosecond Laser Ablation of Silicon: Nanoparticles, Doping and Photovoltaics; Jun. 2007; 174 pages. Carry; Femtosecond-laser Microstructuring of Silicon for Novel Optoelectronic Devices; Jul. 2004; 162 pages.

Nayak; Efficient light trapping in silicon solar cells by ultrafast-laser-induced self-assembled micro/nano structures; Progress in Photovoltaics: Research and Applications; 2011; 9 pages; John Wiley & Sons, Ltd.

* cited by examiner

*Primary Examiner* — Richard A. Booth
(74) *Attorney, Agent, or Firm* — Thorpe North & Western LLP

(57) ABSTRACT

Photovoltaic semiconductor devices and associated methods are provided. In one aspect, for example, a method of making a photovoltaic semiconductor device having enhanced electromagnetic radiation absorption can include applying a damage removal etch (DRE) to a semiconductor material to an RMS surface roughness of from about 0.5 nm to about 50 nm and texturing a single side of the semiconductor material. The texturing further includes irradiating a target region of the semiconductor material with laser radiation to create features having a size of from about 50 nm to about 10 microns.

19 Claims, 2 Drawing Sheets

PHOTOVOLTAIC SEMICONDUCTOR DEVICES AND ASSOCIATED METHODS

PRIORITY DATA

This application claims the benefit of U.S. Provisional Patent Application Ser. No. 61/241,283, filed on Sep. 10, 2009, which is incorporated herein by reference.

BACKGROUND

Various semiconductor devices can be used to absorb and detect photons. Such photo-detecting semiconductor devices are affected by and provide a response to interaction with electromagnetic radiation. Various ranges of electromagnetic radiation can be detected by photo-detecting semiconductor devices, including visible range wavelengths (approximately 400 nm to 700 nm) and non-visible wavelengths (longer than about 700 nm or shorter than 400 nm). The infrared spectrum is often described as including a near infrared portion of the spectrum including wavelengths of approximately 700 to 1300 nm, a short wave infrared portion of the spectrum including wavelengths of approximately 1300 nm to 3 micrometers, and a mid to long wave infrared (or thermal infrared) portion of the spectrum including wavelengths greater than about 3 micrometers up to about 30 micrometers.

SUMMARY

The present disclosure provides methods of making photovoltaic semiconductor devices and associated methods. In one aspect, for example, a method of making a photovoltaic semiconductor device having enhanced electromagnetic radiation absorption can include applying a damage removal etch (DRE) to a semiconductor material to create at least one surface having a root mean square (RMS) surface roughness of from about 0.5 nm to about 50 nm and subsequently texturing a single side of the semiconductor material. The texturing further includes irradiating a target region of the semiconductor material with laser radiation to create features having a size of from about 50 nm to about 10 microns. In another aspect, the DRE is applied to at least one surface to create an RMS surface roughness of from about 0.5 nm to about 5 nm. In yet another aspect, the laser-induced features have a size of from about 0.3 microns to about 2 microns.

Various laser radiation techniques can be utilized to form features of the textured region, and any such technique is considered to be within the present scope. In one aspect, irradiation is performed using a pulsed laser, nonlimiting examples of which include a femtosecond laser, a picosecond laser, a nanosecond laser, and combinations thereof. Additionally, in some aspects irradiating the target region of the semiconductor material further includes exposing the laser radiation to a dopant such that the irradiation incorporates the dopant into the semiconductor material. Substantially an entire surface of the semiconductor layer can be doped, or alternatively, the semiconductor material can be doped in a localized region. In some aspects, the localized region can form a selective emitter. In another aspect, the dopant can be activated at a temperature of greater than about 700° C.

It is also contemplated that a dopant can be activated simultaneously with other process steps occurring to the semiconductor material. Such a situation would apply to dopants that have been incorporated into the semiconductor material via laser irradiation as well as those dopants applied to the semiconductor material through other methods. In one aspect, for example, a metal paste can be coupled to the semiconductor material. The semiconductor material can be heated to a temperature of greater than about 700° C. to simultaneously activate the dopant and bond the metal paste to the semiconductor material.

The quality of the semiconductor device can be improved by annealing the semiconductor material and/or the textured region. In one aspect, for example, the annealing of the semiconductor material is performed to a temperature of from about 300° C. to about 1100° C. In another aspect, the annealing of the semiconductor material is performed to a temperature of from about 500° C. to about 900° C. In some aspects, the semiconductor material has a low oxygen content and the texturing is performed in a substantially oxygen-depleted environment. Although the oxygen content of the semiconductor material can vary depending on variety of factors, including the intended use of the device, in one aspect the semiconductor material has an oxygen content of less than about 50 ppm atomic.

The present disclosure additionally provides an enhanced electromagnetic radiation absorbing semiconductor device. Such a device can include a semiconductor material that has been damage removal etch processed on at least two opposing sides, wherein at least one side of the semiconductor material has an RMS surface roughness of from about 0.5 nm to about 50 nm. The device further includes a textured region disposed on a single side of the semiconductor material, wherein the textured region has been laser irradiated to have features having a size of from about 50 nm to about 10 microns. In another aspect, the damage removal etch is applied to a surface to create an RMS surface roughness of from about 0.5 nm to about 5 nm. In yet another aspect, the laser-induced features have a size of from about 0.3 microns to about 2 microns. In a further aspect, the semiconductor material has not been edge isolation processed.

Various semiconductor materials and configurations are contemplated for use according to aspects of the present disclosure. In one aspect, for example, the semiconductor material includes a member selected from the group consisting of group IV materials, compounds and alloys comprising materials from groups II and VI, compounds and alloys comprising materials from groups III and V, and combinations thereof. In one aspect, the semiconductor material is silicon. In another aspect, the semiconductor material is multicrystalline, microcrystalline, nanocrystalline, polycrystalline, monocrystalline, or a combination thereof. In a more specific aspect, a multicrystalline semiconductor can have a minimum grain size of about 50 nanometers. Additionally, semiconductor materials can be made according to a variety of manufacturing processes. Non-limiting examples include float zone (FZ), Magnetic Czochralski (MCZ), Czochralski (CZ) processes, as well as deposited semiconductor layers and solar wafering methods such as multicrystalline wafer casting. Nonlimiting examples of deposition processes include vapor, physical, or any other known deposition technique.

The present disclosure additionally provides a method of making a photovoltaic semiconductor device having enhanced electromagnetic radiation absorption including applying a damage removal etch to a semiconductor material to create a surface having an RMS surface roughness of from about 0.5 nm to about 50 nm, applying laser radiation through a dopant material and onto a target region to texture and dope a portion of the semiconductor material, applying a least one metal contact to the semiconductor material, and annealing the semiconductor material to a temperature of from about 300° C. to about 1100° C.

DETAILED DESCRIPTION

Figure 1:
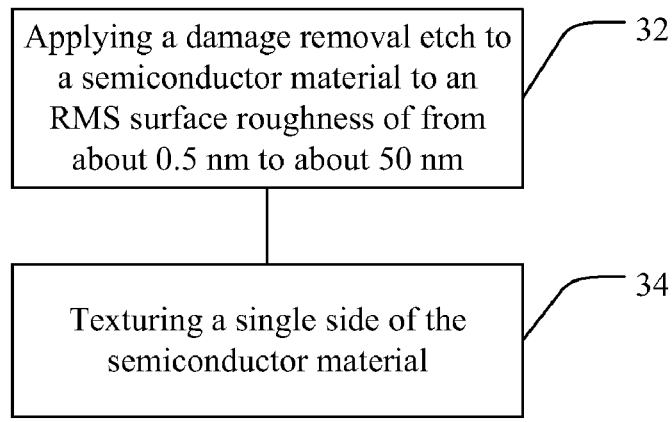
FIG. 1 is a flow diagram of a method of making a photovoltaic semiconductor device in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

In describing and claiming the present disclosure, the following terminology will be used in accordance with the definitions set forth below.

As used herein, the term "low oxygen content" refers to any material having an interstitial oxygen content that is less than or equal to about 60 ppm atomic.

As used herein, the terms "disordered surface" and "textured surface" can be used interchangeably, and refer to a surface having a topology with nano- to micron-sized surface texture formed by the irradiation of laser pulses. While the characteristics of such a surface can be highly variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized crystal structures (e.g. about 2 μm to about 60 μm). In another aspect, the disordered surface can have a topology having texture ranging from 0.1 nm to 1000 μm in size. In yet another aspect, the disordered surface can have a topology having texture ranging from 0.1 nm to 100 μm in size.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser radiation. Surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified using laser radiation. The target region of a semiconductor material can vary as the surface modifying process progresses. For example, after a first target region is doped or surface modified, a second target region may be selected on the same semiconductor material.

The term "coupled" as used herein includes both direct coupling and indirect coupling through an intermediate layer or layers. Thus, for example, when referring to a doped semiconductor layer being coupled to a crystalline semiconductor layer, it can be directly coupled thereto, or through an intermediate layer.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

It is noted that when discussing the present heterojunction photovoltaic devices, systems, and associated methods, each of these discussions can be considered applicable to each of the other embodiments, whether or not they are explicitly discussed in the context of that embodiment. Thus, for example, in discussing a specific structure used in the device, such a structure can also be used in the method of manufacturing the device, and vice versa. Also, in discussing specific details with respect to one specific device, such details are also applicable to other device embodiments.

The Disclosure

The present disclosure provides novel photovoltaic semiconductor devices and methods for making the same. Such photovoltaic devices are made by a method that allows for the optimization and/or the skipping of various traditional processing steps. In many cases, the result is higher semiconductor quality as compared to prior methods.

A more traditional method for making a photovoltaic cell will now be described for comparison and discussion purposes. A wafer is first processed with a damage removal etch (DRE) to remove damage that has occurred during wafer processing. The wafer is additionally wet textured simultaneously with the DRE. These two steps are generally processed concurrently in a chemical bath procedure, and as such, both sides of the wafer are DRE processed and wet textured. Because the wafer is DRE processed and wet textured simultaneously, the chemical bath is formulated to facilitate such simultaneous processing. Due to the fact that the DRE and wet texture processes are different chemical reactions, the formulated chemical bath is not optimized for either DRE or wet texturing. Thus the processed semiconductor material includes DRE and texturing features or characteristics that are a non-optimal tradeoff between these two different processes. The traditional method additionally includes an emitter doping step, an oxide removal step, and edge isolation step, an antireflective coating step, a passivation step, and a metal paste and firing step, to name a few.

Methods according to aspects of the present disclosure often process semiconductor materials using fewer and/or optimized method steps to increase or enhance photovoltaic semiconductor quality. In one aspect, for example, a method of making a photovoltaic semiconductor device having enhanced electromagnetic radiation absorption is provided. As is shown in FIG. 1, the method can include applying a DRE to a semiconductor material to an RMS surface roughness of from about 0.5 nm to about 50 nm 32, and texturing a single side of the semiconductor material 34. In one aspect, the texturing further includes irradiating a target region of the semiconductor material with laser radiation to create features having a size of from about 50 nm to about 10 microns. In another aspect, the DRE is applied to an RMS surface roughness of from about 0.5 nm to about 5 nm. In yet another aspect, the laser-induced features have a size of from about 0.3 microns to about 2 microns. It should be noted that, in some aspects, both sides of the semiconductor material can be textured.

As has been described, the more traditional method of simultaneously DRE processing and wet texturing utilizes a chemistry that is not optimal for either of these processes. By using a laser-based texturing step, the etch chemistry can be optimized around the DRE step, thereby providing a combination of a potentially higher quality DRE and shorter processing time. The higher quality DRE can be realized by reducing the damage created by the multiple chemical processing steps through its replacement with the laser processing step. Optimized DRE can also generate a semiconductor wafer having a smoother surface as compared to the traditional approach. The smooth wafer surface yields better crystalline defect gettering effects during the phosphorous based emitter diffusion process, which in turn improves wafer bulk lifetime and ultimately is more efficient. It should be noted that the devices and methods according to the present aspects are applicable to any solar cell material and wafer type. Non-limiting examples include monocrystalline, multicrystalline, ribbon or edge fed grown (EFG) materials, including thin film solar cells such as microcrystalline or micromorph solar cells.

In addition to optimizing the DRE processing, laser texturing of a semiconductor material allows greater specificity in terms of localization of the texture on the semiconductor, the characteristics of surface features created during texturing, and the specific localization of dopant materials that may be incorporated via the laser irradiation. This specificity not only results in higher quality materials, but it also allows a greater flexibility with regard to the surface architecture of resulting devices. Additionally, laser texturing of the very smooth surfaces produced by the optimized DRE processing can provide unique surface features having reduced structural damage and that have a higher overall quality. For example, the surface features may be more uniform in structure, size, and/or height, and as such, these surface features can more effectively diffuse, trap, and/or absorb electromagnetic radiation.

Various other of the traditional method steps can also be improved and/or eliminated. For example, certain methods traditionally include an emitter doping step followed by an oxide removal step. $H_3PO_4$ and $POCl_3$ doping processes are common in the art. Generally, a doping compound such as $POCl_3$ is applied to the DRE processed and wet textured wafer. The doping compound is heated shortly after application in order to activate the dopant and to bind it into the wafer. Using the laser texturing techniques disclosed herein, however, a dopant can be incorporated into the semiconductor material during the texturing process. Not only does this allow a more selective localization of the dopant, but it also eliminates the separate step of heating the semiconductor to incorporate the dopant. This selective incorporation of dopant also eliminates the need for an oxide removal step or further PSG etching. Additionally, because the laser textured region is antireflective, additional antireflective coating processes can be eliminated. The present techniques additionally allow PECVD passivation to be either simplified or eliminated all together. It should be noted, however, that traditional diffusion doping procedures are considered to be within the present scope, whether or not additional dopant materials are incorporated using the laser process.

Figure 2:
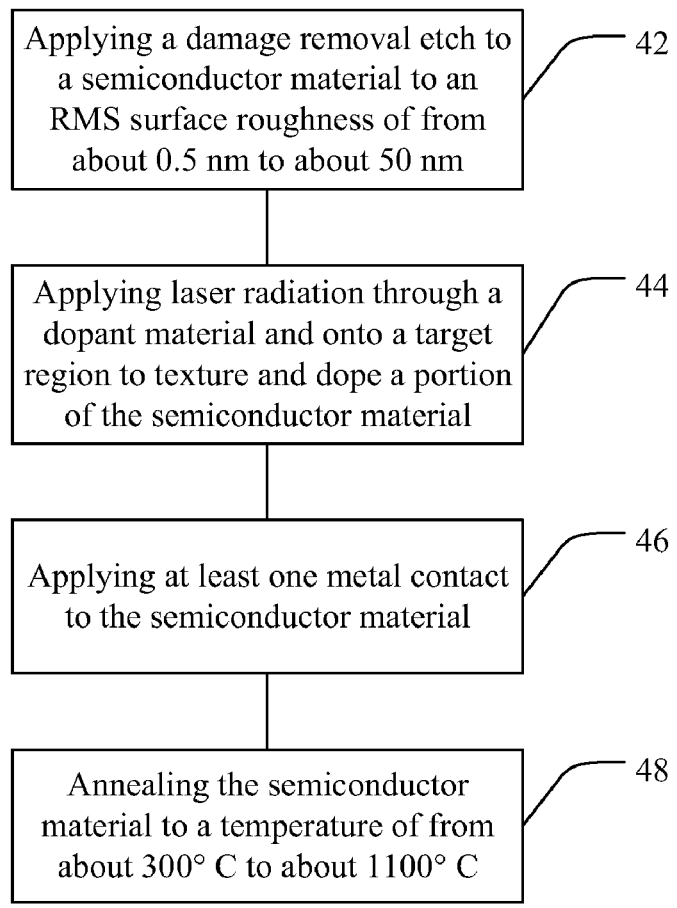
FIG. 2 is a flow diagram of a method of making a photovoltaic semiconductor device in accordance with another aspect of the present disclosure.

Accordingly, as is shown in FIG. 2, a method of making a photovoltaic semiconductor device having enhanced electromagnetic radiation absorption can include applying a damage removal etch to a semiconductor material to an RMS surface roughness of from about 0.5 nm to about 50 nm 42, and applying laser radiation through a dopant material and onto a target region to texture and dope a portion of the semiconductor material 44. The method can also include applying a least one metal contact to the semiconductor material 46 and annealing the semiconductor material to a temperature of from about 300° C. to about 1100° C. 48. In one aspect the method can further include applying a passivation layer to a portion of the semiconductor material.

A variety of semiconductor materials are contemplated for use with the methods and devices according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the crystalline semiconductor material can be or include silicon. In another aspect, the crystalline semiconductor material can include at least one of silicon, carbon, germanium, aluminum nitride, gallium nitride, indium gallium arsenide, aluminum gallium arsenide, and combinations thereof.

Exemplary group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

Additionally, various crystalline types of semiconductor materials are contemplated, and any such material that can be incorporated into a semiconductor device is considered to be within the present scope. Nonlimiting examples of types of semiconductor materials can include nanocrystalline, microcrystalline, multicrystalline, polycrystalline, monocrystalline, and combinations thereof.

Different forms of semiconductor materials can be used to create photovoltaic semiconductor devices. In particular, monocrystilline silicon is produced by introducing a single seed crystal into a molten silicon bath contained within a quartz crucible. Once heated to the desired temperature, the silicon molten mass is pulled from the molten bath and is naturally cooled forming the desired silicon crystal is formed. The diameter of the cylindrical silicon crystal is determined in part by the temperature and rate at which the seed is pulled from the molten bath. From these cylindrical silicon crystals, wafers having diameters of 4 inches, 8 inches and 12 inches can be formed. During this growth process, dopants can be added (i.e. arsenic, boron, phosphorous, etc.) to give the silicon material desired characteristics (i.e. electrical properties), however, non-desired dopants or contaminants can also be introduced in this step. The contaminants can create defects or defect sites in the silicon that can act as recombination centers for electron, hole electrical charge carriers which can in turn reduces the efficiency of the silicon device. Other growth methods have been developed to reduce the amount contaminants introduced in the crystal during the growth process. One such process is called the "Float Zone" growth process. Amorphous silicon can be made by depositing silicon on a glass or plastic substrate at low temperatures (i.e. 75° C.). The deposition process can be done over large areas by a plasma-enhanced chemical vapor deposition (PECVD) processes. This can enable an animated roll to roll process. Once the silicon is deposited, dopants can be introduced into the silicon substrate.

Multi-crystalline silicon can be traditionally produced in a variety of ways. One of the more common ways is a casting method in which low grade silicon is melted and cast into a mold. Typically a square mold, since square wafers fit more compactly into photovoltaic modules. The rate at which the silicon cools defines the final size of the crystals in the silicon ingot. The ingot can then be cut and sliced into the wafers for further processing steps. The additional processing steps may include a wet texture etch on both sides, diffusion doping, a damage removal etch, a plasma silicate glass etch (PSG Etch), and anti-reflective (AR) Coating/PECVD processing. These steps create a semiconductor device conducive for solar photovoltaic applications. As has been described, the present disclosure provides methods and processes that can reduce or eliminate one or more of these additional processing steps and still provide a highly efficient photovoltaic device.

The laser texturing and/or laser doping processing techniques described herein allows the elimination of a variety of the traditional processing steps described above, including, without limitation, the wet texture etch, diffusion doping, the plasma silicate glass etch (PSG Etch), edge isolation, the anti-reflective (AR) coating, and in some cases PECVD passivation. In some aspects the laser texturing process can be used to passivate the semiconductor material. Thus for some cases, texturing, doping, and passivation can occur in a single step. In other aspects, laser processing can be simultaneously carried with other processing steps such as deposition of metallization layers. In this case the metal can be deposited on one side of the semiconductor material while the opposite side is laser processed.

The semiconductor materials of the present disclosure can be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth processes, and the like. Various deposition processes are contemplated, and any known deposition method is considered to be within the present scope. Whether or not low oxygen content is desired in the semiconductor device can also affect the choice of a manufacturing process for the semiconductor material. Various processes produce semiconductor materials containing varying amounts of oxygen, and as such, some applications having more stringent tolerances with respect to oxygen levels may benefit more from certain manufacturing procedures as compared to others. For example, during CZ crystal growth oxygen from the containment vessel, usually a quartz crucible, can become incorporated into the crystal as it is pulled. Additionally, other sources of oxygen contamination are also possible with the CZ process. Such contamination may be reduced, however, through the use of non oxygen-containing crucible materials, as well as the development of other crystal growth methods that do not utilize a crucible. One such process is the FZ process.

Substrates grown with the CZ method can also be made to have lowered oxygen concentration through enhancements to the crystal growth process, such as growing the crystal in the presence of a magnetic field (i.e. the mCz process). Also, gettering techniques can be employed to reduce the impact of oxygen or other impurities on the finished device. These gettering techniques can include thermal cycles to liberate or nucleate impurities, or selective ion implantation of species to serve as gettering sites for the impurities. For example, oxygen concentrated in the semiconductor can be removed by the performing a furnace cycle to form a denuded zone. During heating with an inert gas, oxygen near the surface of the semiconductor diffuses out of the material. During the furnace cycle but after the denuding step, nucleating and growing steps may be performed. Nucleating sites for precipitates are formed during the nucleating step, and the precipitates are grown from the nucleating sites during a growing step. The precipitates are formed from interstitial oxygen within the bulk of the semiconductor material and beneath the denuded zone. The precipitation of oxygen in the bulk of a semiconductor material can be desired because such precipitates can act as gettering sites. Such precipitate formation can also be performed to "lock up" interstitial oxygen into the precipitates and reduce the likelihood that such oxygen can migrates from the bulk of the semiconductor material into the denuded zone.

In those aspects where low oxygen content of the semiconductor device is desired, further processing of the semiconductor material can be performed so as to minimize the introduction of oxygen. Oxygen can exist in different states or at different sites (e.g. interstitially or substitutionally) within a semiconductor such as silicon, dependent upon the thermal processing the semiconductor has received. If the semiconductor is subjected to temperatures higher than, for example, about 1000° C., oxygen can form aggregates or clusters that serve as defect sites in the crystal lattice. These sites may result in trap states and a reduction in carrier lifetime within the semiconductor material will and device. At lower temperatures (e.g. around 400° C. to 700° C.), oxygen can behave as electrically active thermal donors. Thus, oxygen can have a negative impact on carrier lifetime and on carrier mobility. In a device fabricated to have photoconductive gain, the presence of oxygen causing reduced carrier lifetime may result in reduced levels of photoconductive gain.

It may be beneficial, therefore, to produce various semiconductor devices such that a low oxygen content is obtained or maintained. This can be accomplished in a variety of ways, including using semiconductor materials having low levels of oxygen contained therein to begin with, processing these materials in a manner that minimizes the uptake of oxygen into the semiconductor lattice, and utilizing techniques that eliminate or reduce oxygen that may be present in the semiconductor. Such processes and techniques can include, for example, annealing the annealing of the semiconductor material and/or the laser processed region to lower temperatures as compared to previous annealing procedures. In one aspect, an exemplary annealing temperature is from about 300° C. to about 1100° C. In another aspect, such an annealing temperature range is from about 500° C. to about 900° C.

Additionally, laser processing of the semiconductor material and/or the annealing process can be performed in a substantially oxygen-depleted environment in order to minimize the introduction of oxygen into the semiconductor. An oxygen-depleted or substantially oxygen-depleted environment can include a variety of environments. In one aspect, for example, the oxygen-depleted environment can be an environment whereby oxygen from the air or other sources has been replaced with a gas or other fluid containing little to no oxygen. In another aspect, processing can occur in a vacuum environment, and thus contain little to no oxygen. Additionally, oxygen-containing materials or materials that introduce oxygen into the semiconductor material, such as, for example, quartz crucibles, can be avoided. As a practical matter, the term "oxygen-depleted environment" can be used to describe an environment with low levels of oxygen, provided a semiconductor material can be processed therein within the desired tolerances. Thus, environments having low oxygen, or little to no oxygen, are environments in which a semiconductor can be processed as a low-oxygen content semiconductor while maintaining oxygen levels within the tolerances of the present disclosure. In one aspect, an oxygen-depleted environment can be an oxygen-free environment. Further details regarding low-oxygen content semiconductor materials can be found in U.S. patent application Ser. No. 12/771,848, filed on Apr. 30, 2010, which is incorporated herein by reference.

The semiconductor material can have varying levels of oxygen depending on the desired efficiency of the device. In some aspects, oxygen content may be of no concern, and thus any level of oxygen within the lattice is acceptable. In other aspects, a low oxygen content is desired. In one aspect a semiconductor material can have an oxygen content that is less than or equal to about 50 ppm atomic. In another aspect, a semiconductor material can have an oxygen content that is less than or equal to about 30 ppm atomic. In yet another aspect, the semiconductor material can have an oxygen content less than or equal to about 10 ppm atomic. In another aspect the semiconductor material can have an oxygen content less than about 5 ppm atomic. In yet another aspect, the semiconductor material can have an oxygen content less than about 1 ppm atomic.

Traditional solar cells exhibit limited light absorbing characteristics, particularly thin film silicon solar cells. In the case of amorphous silicon, for example, the band gap is such that light beyond 750 nm is not absorbed (as compared to 1100 nm for thick crystalline silicon). The solar spectrum has more than 50% of its energy in wavelengths longer than 750 nm. Therefore, a very large portion of the solar spectrum is not converted to electricity in such thin-film solar cells. The laser processing or laser texturing techniques of the present disclosure can significantly increase the range of wavelengths absorbed, thus allowing efficient light absorption. This textured region thus increases performance of the device, as more light is captured. It should be noted, however, that the present scope is not limited by the thickness of semiconductor materials, and that the principles disclosed herein apply to semiconductor materials of all thicknesses.

A variety of techniques of forming a laser textured region on the semiconductor material are contemplated, and any technique capable of forming such a region should be considered to be within the present scope. In one aspect, for example, a target region of the semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a semiconductor material is irradiated with laser radiation to form a textured or surface modified region. Such laser processing can occur with or without a dopant material. In those aspects where a dopant is used, the laser can be directed through a dopant carrier and onto the semiconductor surface. In this way, dopant from the dopant carrier is introduced into the target region of the semiconductor material.

Such a region incorporated into a semiconductor material can have various benefits in accordance with aspects of the present disclosure. For example, the region typically has a textured surface that increases the surface area of the target region and increases the probability of photon absorption. In one aspect, such a region is a substantially textured surface including micron-sized and/or nano-sized surface features that have been generated by the laser texturing. In another aspect, irradiating the surface of the semiconductor material includes exposing the laser radiation to a dopant such that irradiation incorporates the dopant into the semiconductor material. Various dopant materials are known in the art, and are discussed in more detail herein.

The type of laser radiation used to surface modify a semiconductor material can vary depending on the material and the intended modification. Any laser radiation known in the art can be used with the systems and methods of the present disclosure. There are a number of laser characteristics that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a semiconductor material. It is contemplated that such a pulsed laser can be a femtosecond laser, a picosecond laser, a nanosecond laser, and a combination thereof. Laser pulses can have a central wavelength in a range of about from about 10 nm to about 8 μm, and more specifically from about 200 nm to about 1200 nm. The pulse width of the laser radiation can be in a range of from about tens of femtoseconds to about hundreds of nanoseconds. In one aspect, the laser pulse duration can be the range of from about 1 femtosecond to about 200 picoseconds. In another aspect, laser pulse widths can be in the range of from about 50 femtoseconds to about 50 picoseconds. In yet another aspect, laser pulse widths are in the range of from about 50 to 500 femtoseconds.

These laser conditions ablate the semiconductor surface, and the ultra-fast duration or width of the laser pulse localizes these effects to a small area that is generally within the beam profile for the laser. The reformed material within this area can include dopants, such as sulfur or fluorine, that were present in a laser processing chamber in the form of a gas (e.g. $SF_6$) or a liquid during the ablation process. Thus the semiconductor material is modified through these structural and chemical changes. Additionally, a dopant gas such as $SF_6$ can further create a passivation layer on the surface being processed.

It should be noted that in some aspects a non-pulsed laser may be used to irradiate the semiconductor material. For example, varying the laser wavelength from about 150 nm to about 20000 nm and varying the intensity from about 10 $W/cm^2$ to about $10^9$ $W/cm^2$ can achieve results similar to a pulsed laser system.

The number of laser pulses irradiating a semiconductor target region can be in a range of from about 1 to about 2000. In one aspect, the number of laser pulses irradiating a semiconductor target region can be from about 2 to about 1000. Further, the repetition rate or frequency of the pulses can be selected to be in a range of from about 10 Hz to about 10 μHz, or in a range of from about 1 kHz to about 1 MHz, or in a range from about 10 Hz to about 1 kHz. Moreover, the fluence of each laser pulse can be in a range of from about 1 $kJ/m^2$ to about 20 $kJ/m^2$, or in a range of from about 3 $kJ/m^2$ to about 8 $kJ/m^2$.

A variety of dopant materials are contemplated, and any such material that can be used to surface modify a semiconductor material according to aspects of the present disclosure is considered to be within the present scope. It should be noted that the particular dopant utilized can vary depending on the semiconductor being surface modified and the intended use of the resulting semiconductor material. A dopant can be either electron donating or hole donating. In one aspect, non-limiting examples of dopant materials can include S, F, B, P, N, As, Se, Te, Ge, Ar, Ga, In, Sb, and combinations thereof. It should be noted that the scope of dopant materials can include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of $5.0 \times 10^{-8}$ $mol/cm^3$ – $5.0 \times 10^{-4}$ $mol/cm^3$. $SF_6$ gas is a good carrier for the incorporation of sulfur into the semiconductor material via a laser process without significant adverse effects on the semiconductor material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

Furthermore, the semiconductor materials may comprise multiple layers that vary in majority carrier polarity (i.e. donor or acceptor impurities). The donor or acceptor impurities are typically determined by the type of dopant/impurities introduced into the device either through a growth process, deposition process, epitaxial process, implant process, lasing process, and the like. Typical semiconductor materials can include an n-type layer and a p-type layer. Additionally other device can include the addition of an i-type intrinsic layer, and when used collectively can be referred to as a p-i-n semiconductor material that creates a junction. In other embodiments the semiconductor material can include multiple junctions. An n-type semiconductor material can be made by doping an impurity of valence-five elements to a valence-four semiconductor in order to increase the number of free charge carriers (in this case negative). A p-type semiconductor material can be made doping wherein atoms are added to the semiconductor to increase the number of free charge carriers (in this case positive). An intrinsic (i-type) semiconductor is a substantially undoped semiconductor without significant dopant species present. In some aspects, variations of n(−−), n(−), n(+), n(++), p(−−), p(−), p(+), or p(++) type semiconductor layers can be used. The minus and positive signs are indicators of the relative strength of the doping of the semiconductor material.

The semiconductor materials and devices of the present disclosure can be annealed to improve the overall quality of the material or device. Annealing can enhance the semiconductive properties of the device, including increasing the photoresponse properties of the semiconductor materials. Although any known anneal can be beneficial and would be considered to be within the present scope, annealing at lower temperatures can be particularly useful. Such a "low temperature" anneal can greatly enhance the photoconductive gain and external quantum efficiency of heterojunction devices utilizing such materials. In one aspect, for example, the semiconductor materials can be annealed to a temperature of from about 300° C. to about 110° C. In another aspect, the semiconductor materials can be annealed to a temperature of from about 500° C. to about 900° C. In yet another aspect, the semiconductor materials can be annealed to a temperature of from about 700° C. to about 800° C. In a further aspect, the semiconductor materials can be annealed to a temperature that is less than or equal to about 850° C.

The duration of the annealing procedure can vary according to the specific type of anneal being performed, as well as according to the various materials being used and additional desired results. For example, rapid annealing processes can be used, and as such, durations of the anneal may be shorter as compared to other techniques. Various rapid thermal anneal techniques are known, all of which should be considered to be within the present scope. In one aspect, the semiconductor materials can be annealed by a rapid annealing process for a duration of greater than or equal to about 1 μs. In another aspect, the duration of the rapid annealing process can be from about 1 μs to about 1 ms. As another example, a baking or furnace anneal process can be used having durations that may be longer compared to a rapid anneal. In one aspect, for example, the semiconductor materials can be annealed by a baking anneal process for a duration of greater than or equal to about 1 ms to several hours. It may also be beneficial utilize semiconductor materials having a low oxygen content and to anneal such materials in a substantially oxygen-depleted environment.

Additionally, a passivation region or layer can be included in the various devices of the present disclosure to, among other things, reduce surface recombination in the device and provide anti-reflective properties. The passivation layer can be disposed on the any surface of the semiconductor material, including the textured region. It should be noted that any region, layer, or material of the device that can be passivated is considered to be within the present scope. The layer can be any material capable of providing passivating properties to the device, and any such material is considered to be within the present scope. Nonlimiting examples of passivation materials can include oxides, nitrides, carbides, and the like. Specific examples can include silicon oxide, silicon nitride, amorphous silicon carbide, amorphous silicon, and the like.

Figure 3:
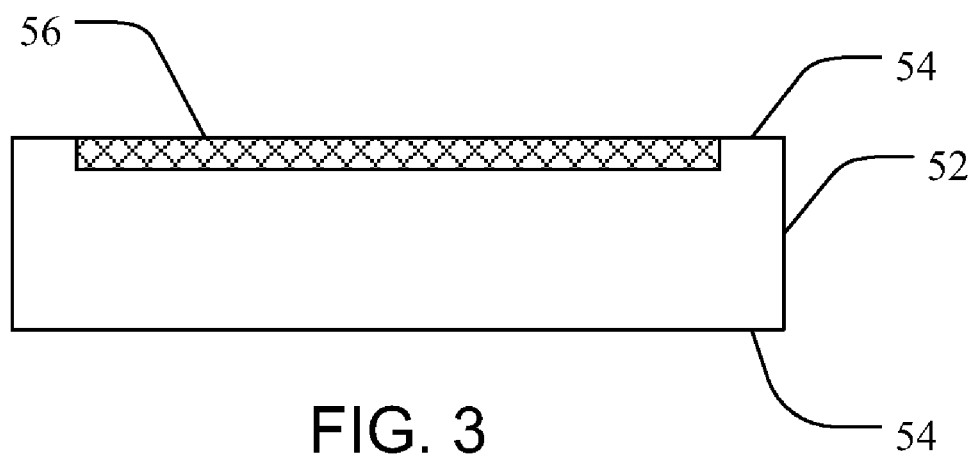
FIG. 3 is a schematic view of a photovoltaic semiconductor device in accordance with a further aspect of the present disclosure.

An exemplary semiconductor device according to one aspect of the present disclosure is shown in FIG. 3. Such a device is an enhanced electromagnetic radiation absorbing semiconductor device including a semiconductor material 52 that has been DRE processed on at least two opposing sides 54. At least one side of the semiconductor material has been DRE etched to an RMS surface roughness of from about 0.5 nm to about 50 nm. The device can further include a textured region 56 disposed on a single side of the semiconductor material, wherein the textured region has been laser irradiated to have features having a size of from about 50 nm to about 10 microns. The textured region can include a dopant in some aspects. Additionally, the semiconductor material can be doped in a localized region to form an emitter. Incorporation of the dopant into the semiconductor material using laser can allow for very specific placement of the dopant, thus allowing the formation of such emitters. Thus in one aspect, the dopant can be localized to form an emitter. In another aspect, the dopant can be localized to form a selective emitter. For the purposes of the present disclosure, an emitter has a single doping profile, while a selective emitter has multiple doping profiles.

As can be seen in FIG. 3, in one aspect a textured region 56 can be formed on only a portion of a surface of the semiconductor material 52. Such a configuration may not require edge isolation due to the specific localization of the textured region and/or the dopant. In other words, edge isolation may not be needed because unlased portions of the semiconductor material can function to isolate the textured region. It should be noted, however, that such a configuration does not preclude separate edge isolation processing.

In another aspect of the present disclosure, a carrier or handler substrate can be utilized to facilitate manipulation of the device during manufacturing and possibly use. Such a carrier substrate can be made from any number of materials. Nonlimiting examples include glass, polymer materials, ceramic materials, metal foils, and combinations thereof. Additionally, in some aspects the carrier substrate can be flexible substrate. Such a flexible substrate can be useful in making and subsequently mounting semiconductor devices on a variety of surfaces. This may be particularly useful for non-planar surfaces. In one aspect, a flexible substrate can be a substrate having a measureable bend radius of curvature of less than or equal to 5 cm.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a photovoltaic semiconductor device having enhanced electromagnetic radiation absorption, comprising:
 applying a damage removal etch to a semiconductor material to create an RMS surface roughness of from about 0.5 nm to about 50 nm; and
 texturing a single side of the semiconductor material, wherein the texturing further includes irradiating a target region of the semiconductor material with laser radiation to create features having a size of from about 50 nm to about 10 microns.

2. The method of claim 1, wherein the damage removal etch is applied to create an RMS surface roughness of from about 0.5 nm to about 5 nm.

3. The method of claim 1, wherein the features have a size of from about 0.3 microns to about 2 microns.

4. The method of claim 1, wherein the target region includes a localized portion of the single side of the semiconductor material.

5. The method of claim 1, wherein irradiation is performed using a pulsed laser selected from the group consisting of a femtosecond laser, a picosecond laser, a nanosecond laser, and combinations thereof.

6. The method of claim 2, wherein irradiating the target region of the semiconductor material further includes exposing the laser radiation to a dopant such that the irradiation incorporates the dopant into the semiconductor material.

7. The method of claim 6, further comprising activating the dopant at a temperature of greater than 700° C.

8. The method of claim 6, wherein the dopant is incorporated in a localized portion of the semiconductor material to form a selective emitter.

9. The method of claim 6, wherein the dopant is incorporated in a localized portion of the semiconductor material to form an emitter.

10. The method of claim 6, further comprising coupling a metal paste to the semiconductor material.

11. The method of claim 10, further comprising heating the semiconductor material to a temperature of greater than about 700° C. to simultaneously activate the dopant and bond the metal paste to the semiconductor material.

12. The method of claim 1, wherein the semiconductor material has a low oxygen content and the texturing is performed in a substantially oxygen-depleted environment.

13. The method of claim 1, further comprising annealing the semiconductor material to a temperature of from about 300° C. to about 1100° C.

14. The method of claim 1, further comprising annealing the semiconductor material to a temperature of from about 500° C. to about 900° C.

15. A method of making a photovoltaic semiconductor device having enhanced electromagnetic radiation absorption, comprising:

applying a damage removal etch to a semiconductor material to create an RMS surface roughness of from about 0.5 nm to about 50 nm;

applying laser radiation through a dopant material and onto a target region to texture and dope a portion of the semiconductor material;

applying a least one metal contact to the semiconductor material; and annealing the semiconductor material to a temperature of from about 300° C. to about 1100° C.

16. The method of claim 15, further comprising applying a passivation layer to a portion of the semiconductor material.

17. The method of claim 15, wherein the laser radiation creates features having a size of from about 50 nm to about 10 microns.

18. The method of claim 17, wherein the features have a size of from about 0.3 microns to about 2 microns.

19. The method of claim 15, wherein the damage removal etch is applied to create an RMS surface roughness of from about 0.5 nm to about 5 nm.

* * * * *